United States Patent
Poelzl

(10) Patent No.: US 9,029,220 B2
(45) Date of Patent: May 12, 2015

(54) METHOD OF MANUFACTURING A SEMICONDUCTOR DEVICE WITH SELF-ALIGNED CONTACT PLUGS AND SEMICONDUCTOR DEVICE

(71) Applicant: Infineon Technologies Austria AG, Villach (AT)

(72) Inventor: Martin Poelzl, Ossiach (AT)

(73) Assignee: Infineon Technologies Austria AG, Villach (AT)

( * ) Notice: Subject to any disclaimer, the term of this patent is extended or adjusted under 35 U.S.C. 154(b) by 50 days.

(21) Appl. No.: 13/920,179

(22) Filed: Jun. 18, 2013

(65) Prior Publication Data
US 2014/0367773 A1 Dec. 18, 2014

(51) Int. Cl.
- H01L 21/336 (2006.01)
- H01L 29/66 (2006.01)
- H01L 29/78 (2006.01)

(52) U.S. Cl.
CPC ...... H01L 29/66666 (2013.01); H01L 29/7827 (2013.01)

(58) Field of Classification Search
CPC .............. H01L 29/7813; H01L 29/66734; H01L 29/7802

USPC .......................................... 438/270, 272, 273
See application file for complete search history.

(56) References Cited

U.S. PATENT DOCUMENTS

| 6,916,745 B2 | 7/2005 | Herrick et al. |
| 2012/0146090 A1* | 6/2012 | Lui et al. ................... 257/139 |

FOREIGN PATENT DOCUMENTS

DE 102004057237 A1 6/2006

* cited by examiner

*Primary Examiner* — Minh-Loan Tran
(74) *Attorney, Agent, or Firm* — Murphy, Bilak & Homiller, PLLC

(57) ABSTRACT

Semiconductor oxide pillars are selectively grown on semiconductor mesas between precursor structures that extend from a main surface into a semiconductor substrate. Spaces between the semiconductor oxide pillars are filled with one or more auxiliary materials to form alignment plugs in a vertical projection of the precursor structures. The semiconductor oxide pillars are removed selectively against the alignment plugs. Contact spacers are provided along sidewalls of the alignment plugs. Between opposing ones of the contact spacers contact plugs are provided directly adjoining the semiconductor mesas. The contact plugs are self-aligned to the semiconductor mesas and allow a further reduction of the lateral dimensions of the semiconductor mesas without recessing the semiconductor mesas.

10 Claims, 9 Drawing Sheets

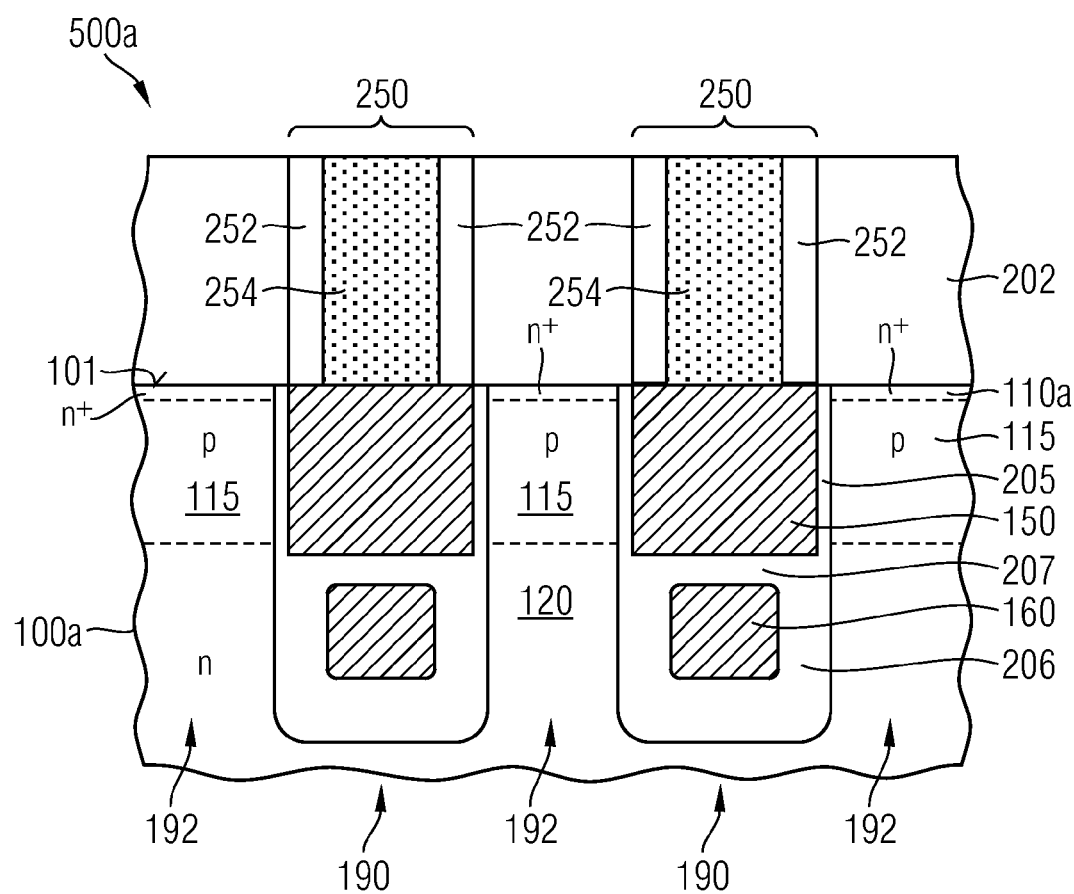

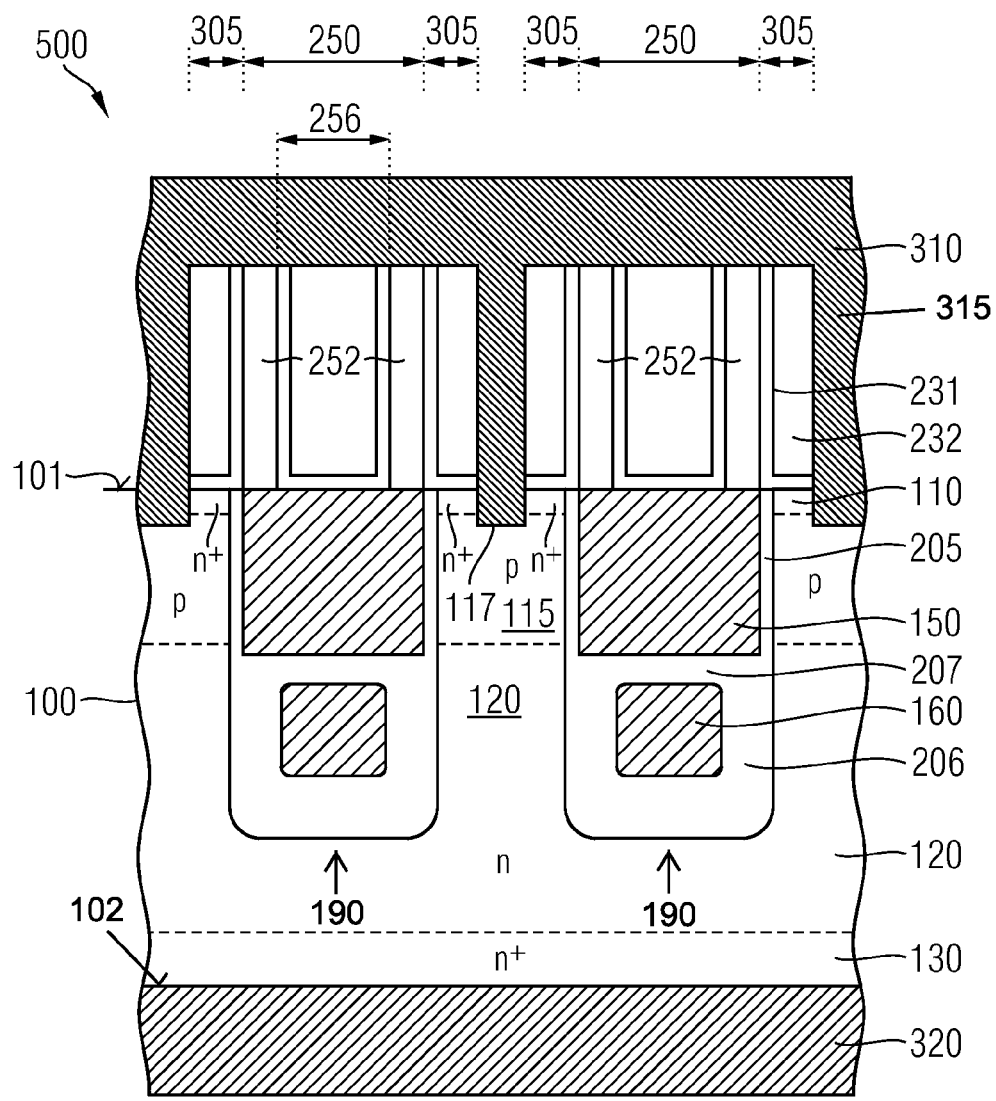

METHOD OF MANUFACTURING A SEMICONDUCTOR DEVICE WITH SELF-ALIGNED CONTACT PLUGS AND SEMICONDUCTOR DEVICE

BACKGROUND

Semiconductor devices which are based on IGFET (insulated gate field effect transistor) cells may include subsurface structures including gate electrodes. For providing contacts to impurity zones formed in semiconductor mesas between the subsurface structures a photolithographic mask defining placement and size of contact openings for the contacts is aligned with a photolithographic mask defining placement and size of the subsurface structures. Alignment tolerances between the two photolithographic masks define a minimum distance between neighboring subsurface structures. Approaches replacing the mask lithography for the contact openings by a self-aligned contact regime allow for further reducing the distances between neighboring subsurface structures to exploit carrier confinement effects. It is desirable to provide semiconductor devices with small distances between neighboring subsurface structures in a reliable way.

SUMMARY

An embodiment is related to a method of manufacturing a semiconductor device. Semiconductor oxide pillars are selectively grown on semiconductor mesas between precursor structures that extend from a main surface into a semiconductor substrate. Spaces between the semiconductor oxide pillars are filled with at least one auxiliary material to form alignment plugs in a vertical projection of the precursor structures. The semiconductor oxide pillars are removed selectively against the alignment plugs. Contact spacers are provided along sidewalls of the alignment plugs. Between opposing ones of the contact spacers contact plugs are provided that directly adjoin the semiconductor mesas.

According to another embodiment a semiconductor device includes subsurface structures that extend from a main surface into a semiconductor portion. Each subsurface structure includes a gate electrode that is dielectrically insulated from the semiconductor portion. In a vertical projection of the subsurface structures the semiconductor device includes alignment plugs. Contact spacers extend along sidewalls of the alignment plugs that are tilted to the main surface. Between opposing ones of the contact spacers contact plugs directly adjoin semiconductor mesas inbetween the subsurface structures.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the disclosure and are incorporated in and constitute a part of this specification. The drawings illustrate the embodiments of the present disclosure and together with the description serve to explain principles of the disclosure. Other embodiments and intended advantages will be readily appreciated as they become better understood by reference to the following detailed description.

FIG. 3E is a schematic cross-sectional view of the semiconductor substrate portion of FIG. 3D after providing alignment plugs.

FIG. 4A is a schematic cross-sectional view of a portion of a semiconductor device in accordance with an embodiment providing self-aligned contact plugs for impurity zones formed in semiconductor mesas.

DETAILED DESCRIPTION

In the following detailed description, reference is made to the accompanying drawings, which form a part hereof, and in which are shown by way of illustrations specific embodiments in which the disclosure may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present disclosure includes such modifications and variations. The examples are described using specific language which should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open and the terms indicate the presence of stated structures, elements or features but not preclude additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may be provided between the electrically coupled elements, for example elements that are controllable to temporarily provide a low-ohmic connection in a first state and a high-ohmic electric decoupling in a second state.

The Figures illustrate relative doping concentrations by indicating "−" or "+" next to the doping type "n" or "p". For example, "n$^-$" means a doping concentration which is lower than the doping concentration of an "n"-doping region while an "n$^+$"-doping region has a higher doping concentration than an "n"-doping region. Doping regions of the same relative doping concentration do not necessarily have the same absolute doping concentration. For example, two different "n"-doping regions may have the same or different absolute doping concentrations.

Figure 1A:
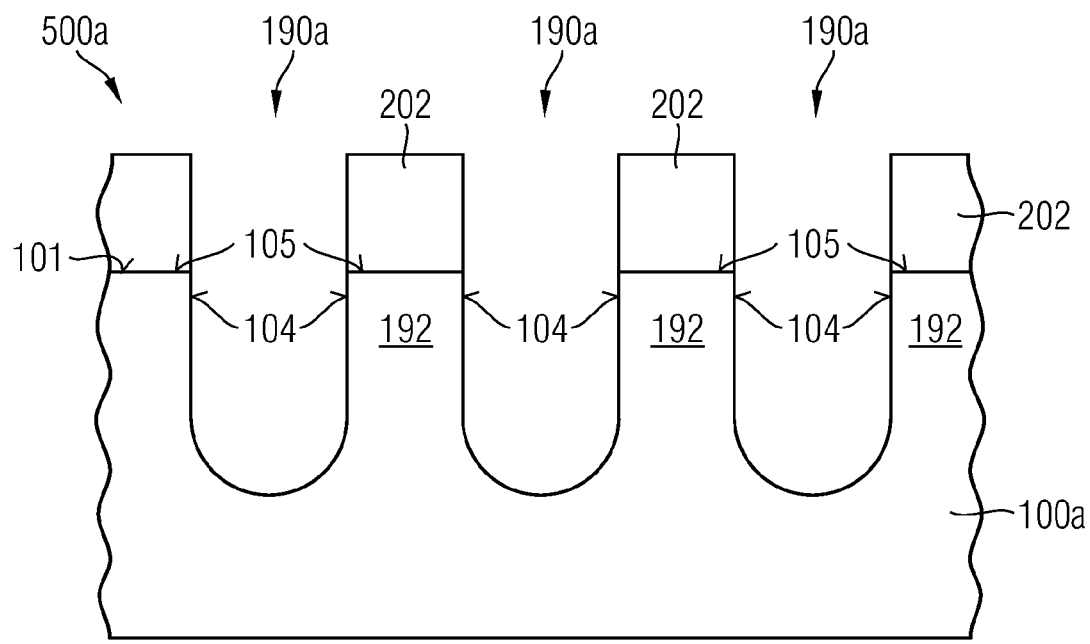
FIG. 1A is a schematic cross-sectional view of a portion of a semiconductor substrate in accordance with an embodiment of a method of manufacturing a semiconductor device after growing semiconductor oxide pillars on semiconductor mesas.

FIG. 1A shows a semiconductor substrate 500a consisting of or containing a semiconductor layer 100a of a single crystalline semiconductor material. The semiconductor substrate 500a may be a semiconductor wafer or a semiconductor-on-insulator wafer from which a plurality of identical semiconductor dies is obtained, respectively. The single crystalline semiconductor material may be silicon Si, silicon carbide SiC, germanium Ge, a silicon germanium crystal SiGe, gallium nitride GaN or gallium arsenide GaAs, by way of example.

From a main surface 101 one or more precursor structures 190a extend into the semiconductor layer 100a. The precursor structures 190a may be empty trenches, trenches lined with a sidewall structure, partially filled trenches, or completely filled trenches. For example, the precursor structures 190a may include dielectric structures and/or conductive structures which may be electrically insulated from the semiconductor layer 100a. Between the precursor structures 190a end faces 105 of semiconductor mesas 192 form sections of the main surface 101.

Semiconductor oxide pillars 202 are selectively grown on the end faces 105 of the semiconductor mesas 192, wherein the growth rate on the end faces 105 exceeds at least 2 times, for example at least 5 times the growth rate in the region of the precursor structures 190a. According to an embodiment, the growth rate on the end faces 105 is at least 10 times the growth rate on exposed sidewall surfaces 104 of the semiconductor mesas 192.

The selectivity of the growth process may be obtained by exposing the sidewall surfaces 104 of the semiconductor mesas 192 and using an epitaxial growth process exploiting different growth rates on different crystallographic orientations.

According to another embodiment the main surface 101 or the exposed sidewall surfaces 104 are treated in a way that changes the oxide growth rate on the respective surface. For example, a stop mask may be provided that exposes the end faces 105 and that covers at least the sidewall surfaces 104 or the complete trench surface of the precursor structures 190a. For example, a stop layer thinner than half of the width of the precursor structures 190a is deposited or grown to line both the trenches and the end faces 105. A sacrificial material is deposited that fills the trenches. The sacrificial material is recessed to expose the portions of the stop layer on the end faces 105 while still filling the trenches. Exposed portions of the stop layer are removed using the remnants of the sacrificial material in the trenches as an etch mask. Then the remnants of the sacrificial material may be removed. Other embodiments may provide a spacer etch of the stop layer. The material of the stop layer is selected to locally reduce or suppress the growth of the semiconductor oxide, for example silicon nitride.

Another embodiment may provide a supplementary material filling at least upper sections of the precursor structures 190a, wherein the supplementary material may be inert in an ambient providing a semiconductor oxide growth on the semiconductor mesas 192, or wherein a reaction product of the supplementary material resulting at the conditions for a subsequent oxide growth on the semiconductor mesas 192 is selectively removable against the grown semiconductor oxide and the semiconductor material of the semiconductor layer 100a.

According to a further embodiment the precursor structures 190a are filled with a sacrificial material with a surface flush with the main surface 101 and the end faces 105. Impurities are introduced into the main surface 101 to form implant zones directly adjoining the end faces 105 of the semiconductor mesas 192. After formation of the implant zones, at least portions of the sidewall surfaces 104 oriented to the main surface 101 are exposed. An oxidation process is controlled, exploiting that the growth rate of semiconductor oxide depends on the impurity concentration in the underlying semiconductor substrate.

FIG. 1A shows the semiconductor oxide pillars 202 grown on the end faces 105 of the semiconductor mesas 192 between the precursor structures 190a. Further materials may be deposited to obtain finalized subsurface structures 190 on the basis of the precursor structures 190a of FIG. 1A. The subsurface structures 190 may include one or more dielectric structures and/or one or more conductive structure dielectrically insulated from the semiconductor portion 100. For example, the subsurface structures 190 include one single conductive structure, e.g. a gate electrode of an IGFET cell of a power switching device, e.g. an IGFET or IGBT (insulated gate bipolar transistor), or a cell of a JFET (junction field effect transistor) by way of example. According to other embodiments, the subsurface structures 190 include a second conductive structure dielectrically insulated from the other, for example a field electrode. A first edge of the subsurface structures 190 may be flush with the end faces 105 of the semiconductor mesas 192.

Spaces between the semiconductor oxide pillars 202 above the subsurface structures 190 may be filled with one or more auxiliary materials, for example by depositing the auxiliary materials and removing portions of the auxiliary materials above the semiconductor oxide pillars 202.

Figure 1B:
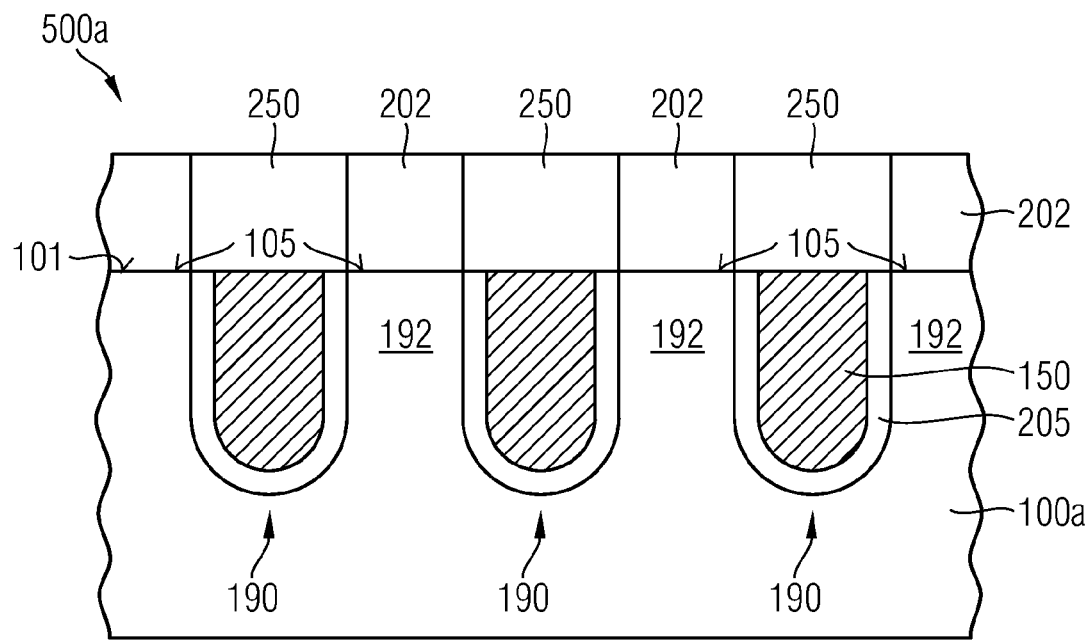
FIG. 1B is a cross-sectional view of the semiconductor substrate portion of FIG. 1A after providing alignment plugs between the semiconductor oxide pillars.

FIG. 1B shows the subsurface structures 190 including a gate electrode 150 provided from a conductive material, e.g. heavily doped polycrystalline silicon (polysilicon) and a dielectric layer 205 dielectrically insulating the gate electrode 150 from the semiconductor layer 100a. In the vertical projection of the subsurface structures 190 are alignment plugs 250, whereby a vertical direction is a direction orthogonal to the main surface 101 and directions parallel to the main surface 101 are lateral directions. The alignment plugs 250 may consist of one single material According to other embodiments, the alignment plugs 250 include layers of more than one material.

The auxiliary materials may be any materials against which the semiconductor oxide can be removed with high selectivity. For example, the at least one auxiliary material is silicon nitride, carbon, amorphous silicon or doped or undoped polycrystalline silicon. The alignment plugs 250 may have a homogeneous structure provided from one single auxiliary material or may include a structure of two or more different auxiliary materials, for example a layered structure including layers of deposited semiconductor oxides, semiconductor oxynitrides, semiconductor nitrides, undoped silicon glass or doped silicon glasses.

The semiconductor oxide pillars 202 are removed, for example by using a wet etch process at 800 degree Celsius which is selective against the auxiliary materials and the semiconductor material of the semiconductor layer 100a. A conformal spacer layer may be deposited having a thickness less than half of the width of the semiconductor mesas 192. The conformal spacer layer may include a deposited semiconductor oxide, a semiconductor oxynitride, a semiconductor nitride, undoped silicon glass or a doped silicon glass, by way of example. The conformal spacer layer is highly anisotropically etched, for example using an RIE (reactive ion beam etching) to remove horizontal sections selectively against vertical sections.

Figure 1C:
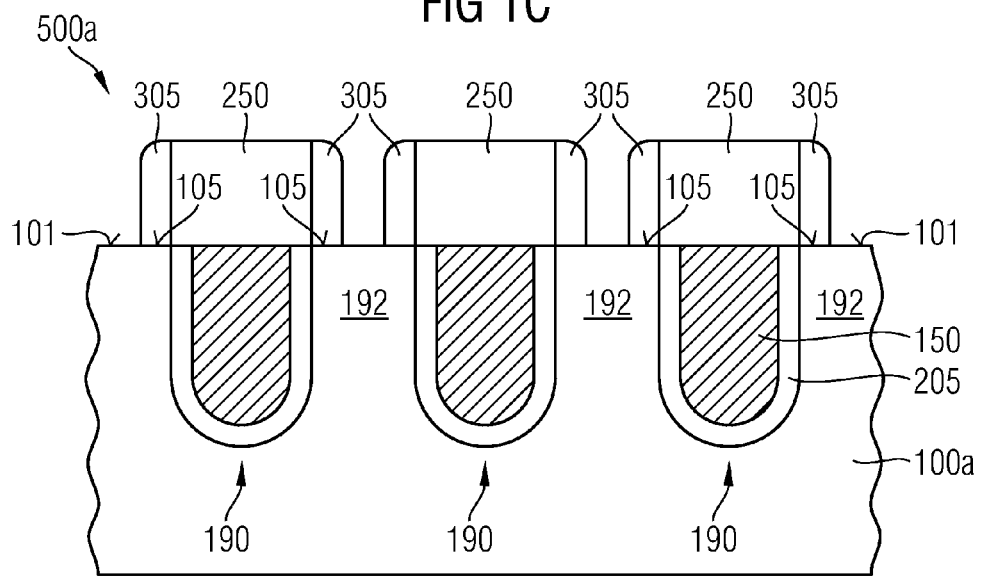
FIG. 1C is a schematic cross-sectional view of the semiconductor substrate portion of FIG. 1B after providing contact spacers along sidewalls of the alignment plugs.

The resulting contact spacers 305 extending along the sidewalls of the alignment plugs 250 are shown in FIG. 1C. The sidewalls of the alignment plugs 250 are tilted to the main surface 101. According to an embodiment, the sidewalls are vertical or approximately vertical with respect to the main surface 101 to support the formation of contact spacers 305. The material of the contact spacers 305 is etchable with high selectivity against the auxiliary material of the alignment plugs 250 and the semiconductor material of the semiconductor layer 100a. The alignment plugs 250 and the contact spacers 305 may provide a combined etch mask for introducing contact grooves into exposed sections of the main surface 101 in the center of the end faces 105 of the semiconductor mesas 190. A highly conductive material may be deposited in the contact grooves and the openings between the contact spacers 305.

Figure 2:
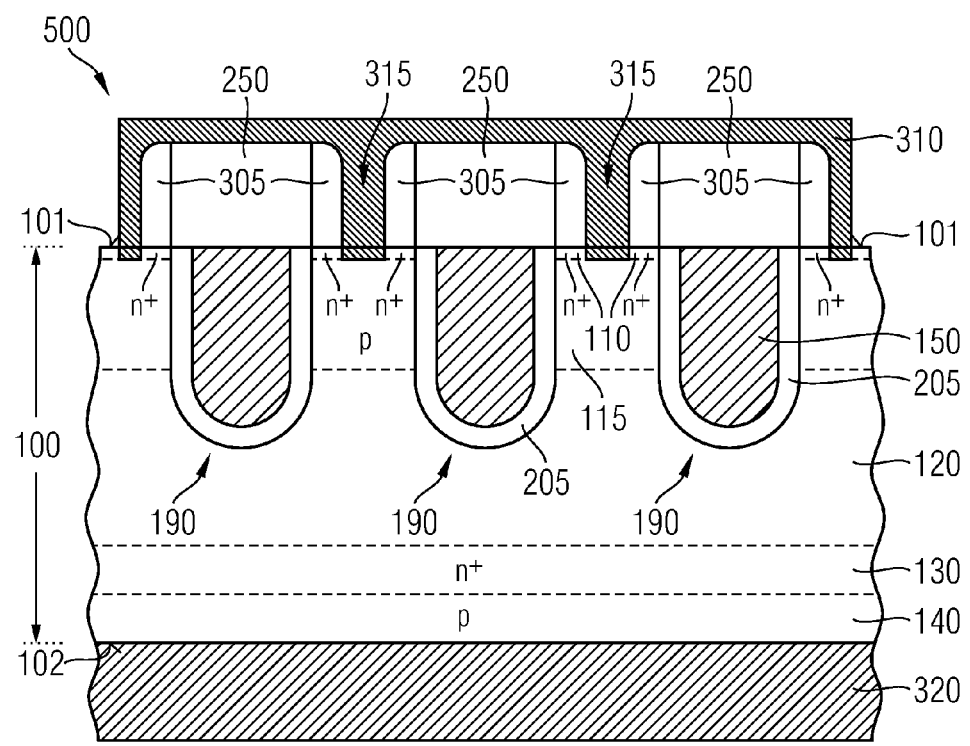
FIG. 2 is a schematic cross-sectional view of a portion of a semiconductor device obtained from the method illustrated in FIGS. 1A to 1C.

FIG. 2 illustrates a semiconductor device 500 obtained from one of a plurality of identical semiconductor dies processed as a portion of the semiconductor substrate 500a of FIGS. 1A to 1C. The semiconductor device 500 may be a power switching device, e.g. a power IGFET or IGBT. According to the illustrated embodiment the semiconductor device 500 includes subsurface structures 190 extending from a main surface 101 into a semiconductor portion 100 and including dielectric layers 205 dielectrically insulating conductive gate electrodes 150 from a semiconductor portion 100. The main surface 101 is the original surface of the semiconductor portion 100 after a last epitaxy process for the formation of the semiconductor portion 100 and before a first recess process at least in sections reducing a thickness of the semiconductor portion from the side of the main surface 101. In the finalized semiconductor device 500 a distance between the main surface 101 and a planar rear side surface 102 is the same in a cell area comprising IGFET cells and in an edge area without IGFET cells and including termination structures.

The semiconductor mesas 192 may include source zones 110 of a first conductivity type directly adjoining the main surface 101 in the semiconductor mesas 192. The semiconductor mesas 192 further include body zones 115 of a second conductivity type, which is complementary to the first conductivity type. The body zones 115 separate the source zones 110 from a drift zone 120 of the first conductivity type. The dielectric layers 205 may dielectrically couple the gate electrodes 150 with the body zones 115. According to the illustrated embodiment, the first conductivity type is n-type and the second conductivity type is p-type. Other embodiments may provide p-type as the first and n-type as the second conductivity type.

In the vertical projection of the subsurface structures 190 above the main surface 101 are alignment plugs 250. Sidewalls of the alignment plugs 250 are tilted to the main surface 101, for example perpendicular to the main surface 101. Contact spacers 305 extend along the sidewalls of the alignment plugs 250. A first electrode structure 310 provided on the side of the main surface 101 is electrically connected to the source zones 110 and the body zones 115 through contact plugs 315 between neighboring contact spacers 305.

The drift zone 120 forms a planar interface with a heavily doped drain layer 130 of the same conductivity type. According to an embodiment related to IGFETs, the heavily doped drain layer 130 directly adjoins a second electrode structure 320 at the rear surface 102 opposite to the main surface 101. According to the illustrated embodiment, which relates to IGBTs, a collector layer 140 of the second conductivity type separates the drain layer 130 and the second electrode 320.

The contact plugs 315 are formed without an additional lithographic mask such that no alignment errors must be taken into account when defining the minimum distance between neighboring ones of the subsurface structures 190. The performance of the semiconductor device 500 can be increased by applying carrier confinement techniques striving for further reducing the distance between neighboring ones of the subsurface structures 190 to less than 300 nm, for example to about 200 nm and less.

Other than conventional approaches providing self-aligned contacts to semiconductor mesas by using position information available below a main surface, for example by recessing the semiconductor portion between the subsurface structures, the present embodiments project the position information to above the main surface 101. As a consequence, the source zones 110 may be formed along the original main surface 101. Since the upper edge of the source zones 110 is not defined by etch processes that may introduce dimension fluctuations, the present embodiments suffer less from process inhomogeneities than IGFET cells whose semiconductor upper edge is defined by a recess etch. As a consequence, lower device parameter deviations among semiconductor devices 500 obtained from the same wafer or from different wafers can be observed.

Figure 3A:
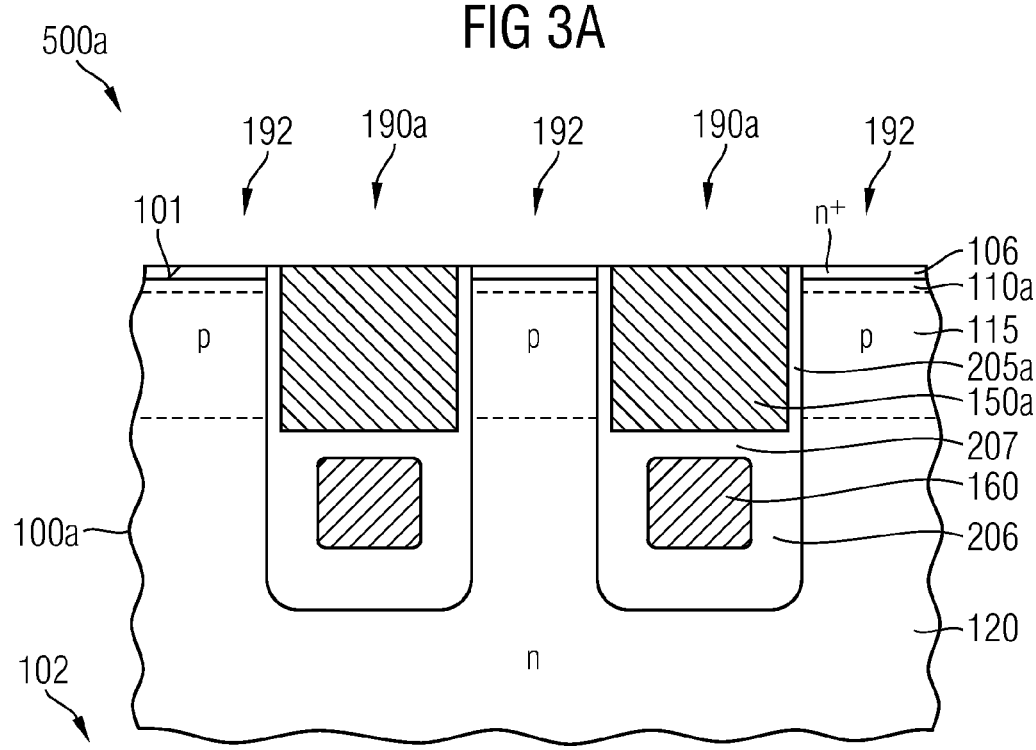
FIG. 3A is a schematic cross-sectional view of a portion of a semiconductor substrate during a method of manufacturing a semiconductor device in accordance with an embodiment exploiting growth rate variations induced by impurities after depositing and planarizing an auxiliary material.

FIGS. 3A to 3G illustrate a method of manufacturing a semiconductor device, wherein the method exploits different growth rates for semiconductor oxides on bases with different impurity concentrations. FIG. 3A shows a portion of a semiconductor substrate 500a, which may be a single crystalline silicon wafer or a silicon-on-insulator wafer, by way of example. The semiconductor substrate 500a includes a plurality of identical semiconductor dies. Each die includes a semiconductor portion 100a which is a section of a semiconductor layer that may include one or more epitaxy layers and a base substrate. The semiconductor portion 100a may contain impurities of a first conductivity type. Gate trenches are introduced into the semiconductor portion 100a from a main surface 101. The gate trenches may be regularly spaced stripes. According to other embodiments, the lateral cross-sections of the gate trenches may be circular, oval, elliptic, or rectangular, for example quadratic, with or without rounded corners. A first field dielectric 206 may be thermally grown or deposited and removed from outside the gate trenches and from a first section of the gate trenches directly adjoining the main surface 101 such that the first field dielectric 206 lines a second section of the gate trenches in a distance to the main surface 101. A field electrode material may be deposited and removed from the first sections of the gate trenches to form field electrodes 160 in the second sections of the gate trenches 190.

A second field dielectric 207 may be thermally grown or deposited on the field electrodes 160 and on the sidewalls in the first sections of the gate trenches. A protection layer 106 may be formed on semiconductor mesas 192 between the gate trenches. For example, the protection layer 106 is a semiconductor oxide layer grown on the semiconductor portion 100a and may have a thickness of about 2 to 10 nm, for example about 5 nm. A sacrificial material 150a is deposited to fill the first sections of the gate trenches above the second field dielectrics 207. Portions of the sacrificial material 150a outside the gate trenches and above the main surface 101 are removed.

According to an embodiment, the removal of the sacrificial material 150a may be a CMP (chemical mechanical polishing) process planarizing both the semiconductor portion 100s and the exposed surface of the sacrificial material 150a such that the upper edge of the sacrificial material 150a is flush with the main surface 101. Impurities of the second conductivity type are introduced into semiconductor mesas 192 between the gate trenches through the main surface 101, for example by an implant which may be masked or unmasked. The impurities of the second conductivity type may be tempered to form a body zone 115 in first sections of the semiconductor mesas 192 adjoining the main surface 101. A buried edge of the body zones 115 may be approximately adjusted with a buried edge of the sacrificial material 150a. Impurities of the first conductivity type are implanted through the main surface 101. The impurities of the first conductivity type locally counter-dope portions of the body zones 115 close to the main surface 101, wherein implant zones 110a of the first conductivity type are formed between the main surface 101 and the body zones 115.

According to an embodiment the first conductivity type is n-type and arsenic As atoms are implanted at a dose of at least $10^{15}$ cm$^{-2}$.

FIG. 3A shows the gate trenches forming precursor structures 190a between the semiconductor mesas 192. A first field dielectric 206 dielectrically insulates field electrodes 160 in the second sections of the precursor structures 190a spaced from the main surface 101 from the surrounding semiconductor portion 100a. A sacrificial material 150a fills first sections of the precursor structures 190a between the main surface 101 and a second field dielectric 207 on the field electrodes 160. The sacrificial material 150a may be any material which is selectively removable against the second field dielectric 206 and the semiconductor material of the semiconductor portion 100a, for example amorphous silicon, polycrystalline silicon, or carbon. A vertical dielectric layer 205a separates the sacrificial material 150a from the semiconductor portion 100a. In the semiconductor mesas 192 between the precursor structures 190a, implant zones 110a of the first conductivity type directly adjoin the main surface 101. The body zones 115 of the second conductivity type separate the implant zones 110a from a drift layer 120. A protection layer 106 covers at least the semiconductor mesas 192 and may cover the sacrificial material 150a in the precursor structures 192.

Due to the flush surface after CMP, no shadowing effects occur during introduction of the impurities such that the implant zones 110a and the body zone 115 are uniform in the lateral directions. The implant zones 110a both serve as precursor zones for the source zones 110 and define a basis of strong oxide growth in the vertical direction. The sacrificial material 150a is removed, for example using a wet etch process, whereby the vertical dielectric 205a may be partly or completely removed. According to other embodiments, the vertical dielectric layer 205a is not removed.

Figure 3B:
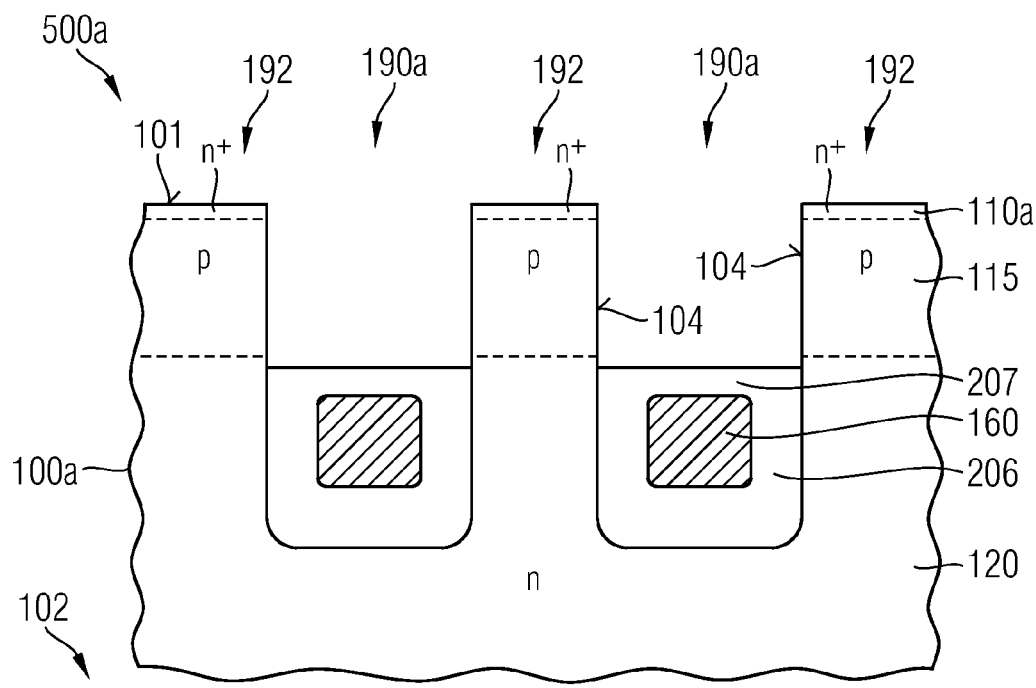
FIG. 3B is a schematic cross-sectional view of the semiconductor substrate portion of FIG. 3A after removing the auxiliary material.

FIG. 3B shows the precursor structures 190a after removal of the sacrificial material 150a and the vertical dielectric layer 205a. The first sections of the precursor structures 190a between the main surface 101 and the second field dielectric 207 are empty. The protection layer 106 may also be removed either in a separate process or in the course of one of the processes for removing the sacrificial material 150a and vertical dielectric layer 205a.

An oxidation process is controlled under process conditions exploiting different growth rates on bases having different impurity concentrations, for example a low temperature wet oxidation process at about 800 degree Celsius, wherein an oxidation rate in the vertical direction on the basis of the heavily doped impurity zone 110a is about 10 to 30, for example about 20 times the oxidation rate along exposed sections of the sidewall surfaces 104 of the semiconductor mesas 192.

Figure 3C:
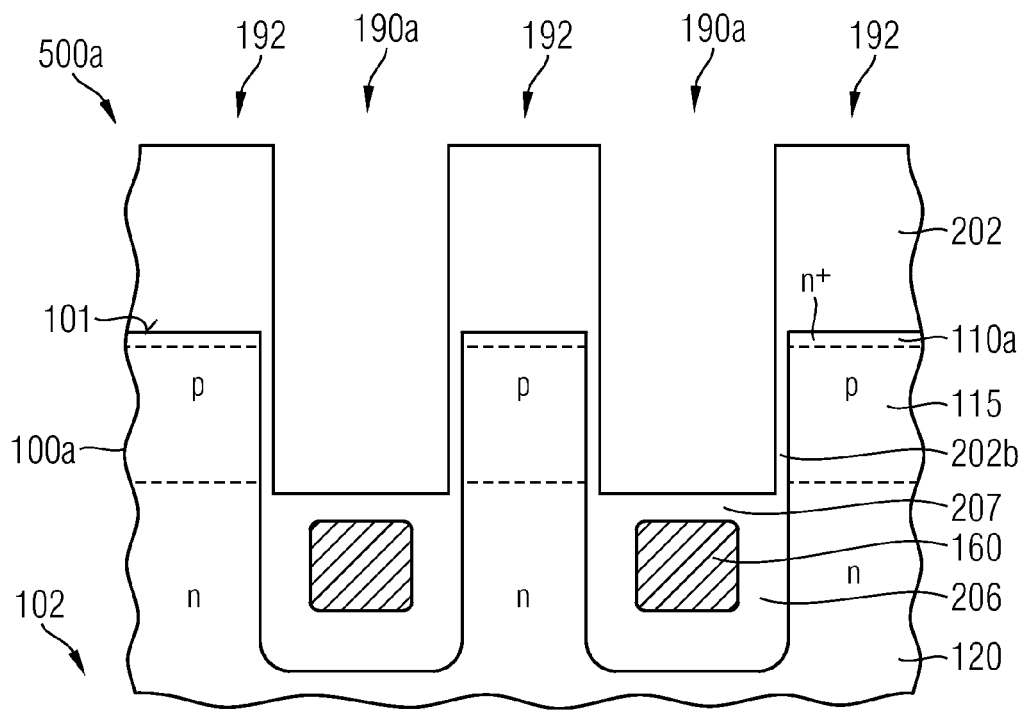
FIG. 3C is a schematic cross-sectional view of the semiconductor substrate portion of FIG. 3B after growing semiconductor oxide pillars.

FIG. 3C shows semiconductor oxide pillars 202 grown in the vertical direction on the semiconductor mesas 192 and vertical semiconductor oxide liners 202b grown along the exposed portions of the exposed sidewall surfaces 104 of the semiconductor mesas 192 in the first sections of the precursor structures 190. The height of the semiconductor oxide pillars 202 over the main surface 101 may be between 100 and 300 nm, for example about 200 nm. The thickness of the vertical semiconductor oxide liners 202b may be between 5 and 20 nm, for example about 10 nm. According to an embodiment, the vertical semiconductor oxide liner 202b is removed. According to other embodiments, the vertical semiconductor oxide liner 202b forms a portion of or the complete gate dielectric in a finalized semiconductor device. According to an embodiment, the semiconductor oxide liner 202b is removed in an HF-b cleaning process and a gate dielectric 205 is formed by thermal growth or by deposition of a dielectric material, for example a silicon oxide formed by providing TEOS (tetraethylorthosilane) as precursor material, alumina $Al_2O_3$ or other materials known in the art for forming gate dielectrics. One or more conductive materials are deposited and recessed to obtain finalized subsurface structures 190 from the filled precursor structures 190a.

Figure 3D:
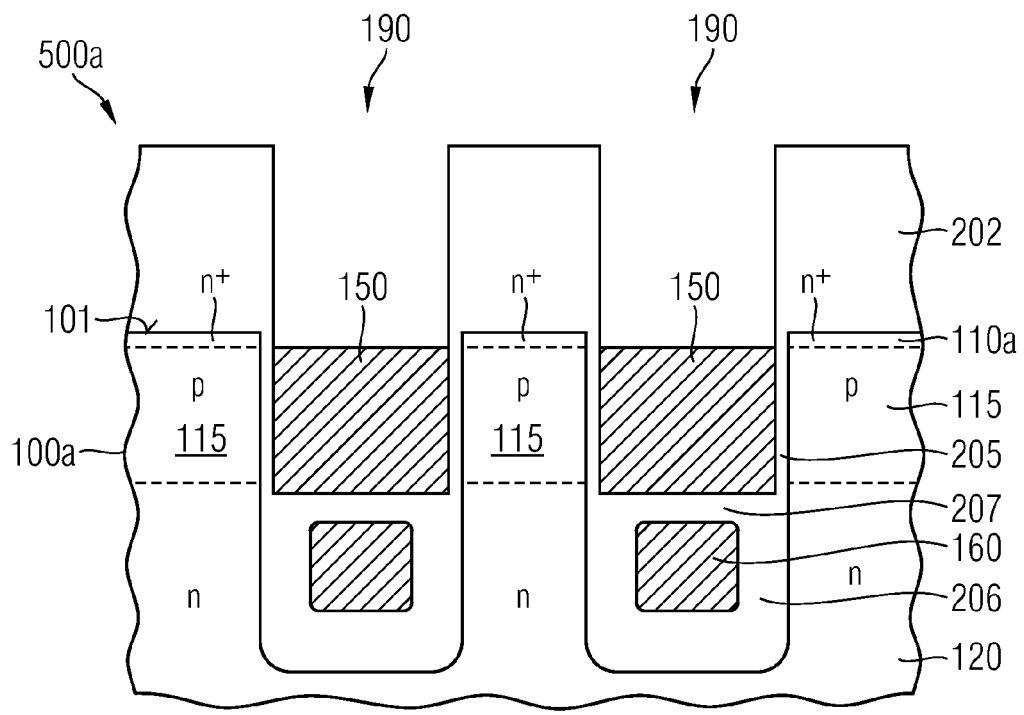
FIG. 3D is a schematic cross-sectional view of the semiconductor substrate portion of FIG. 3C after depositing and recessing a gate electrode material.

FIG. 3D shows the gate dielectric 205 formed along the vertical sidewalls of the semiconductor mesas 192 and gate electrodes 150 formed in the first sections of the subsurface structures 190. A buried edge of the gate electrodes 150 is in substance adjusted to a buried edge of the base zones 115 and may overlap to some degree with the drift zone 120.

An upper edge of the gate electrodes 205 may be adjusted to the buried edge of source zones emerging from the impurity zones 110a and may overlap with the source zones to some degree. A cap layer may be formed above the gate electrodes 150. The cap layer may be a grown or deposited semiconductor oxide layer. According to another embodiment the gate electrodes 150 are flush or approximately flush with the main surface 101 or recessed to a distance to the main surface 101 to at most 150 nm. Avoiding any recess or providing only a very shallow recess of the gate electrodes 150 reduces process-induced fluctuations of device parameters concerning the gate capacities, e.g. the gate-drain Charge Qgd and the gate charge Qg.

The spaces between the semiconductor oxide pillars 202 are filled with at least one auxiliary material, to form alignment plugs 250. According to the illustrated embodiment, a first auxiliary material is deposited in a conformal manner, wherein the thickness of the first auxiliary material is less than half the width of the spaces between the semiconductor oxide pillars 202. The semiconductor oxide pillars 202 are selectively removable against the first auxiliary material. A spacer etch is performed to remove horizontal portions of the deposited first auxiliary material above the semiconductor oxide pillars 202, the semiconductor mesas 192 and the gate electrode 150. The remaining portions of the first auxiliary material form gate contact spacers 252 along sidewalls of the semiconductor oxide pillars 202. A second auxiliary material, which may be selectively removable against the first auxiliary material, may be deposited, may fill the remaining space between the gate contact spacers 252, and may form place holder structures 254 above the gate electrodes 150. The first auxiliary material may be a oxynitride or nitride film with a uniform thickness in a range from 35 nm to 65 nm, for example about 50 nm.

FIG. 3E shows both the gate contact spacers 252 extending along vertical sidewalls of the semiconductor oxide pillars 202 and the place holder structures 254 above the gate electrodes 150. The gate contact spacers 252 may have a thickness from 35 nm to 65 nm, for example about 50 nm. The place holder structures 254 may be provided from amorphous silicon, polycrystalline silicon, or carbon, by way of example. The place holder structures 254 and the gate contact spacers 252 in combination form alignment plugs 250.

The semiconductor oxide pillars 202 are removed. The removal of the semiconductor oxide pillars 202 may be combined with the removal of the place holder structures 254, wherein the removal of the place holder structures 254 may include an in-situ carbon ash. According to other embodiments, the place holder structures 254 are maintained.

A conformal spacer layer, which may include one single layer from the same material or two or more layers of different materials is deposited, wherein the spacer layer may completely fill the space between opposing gates contact spacers 252 above the gate electrodes 150 but does not fill the spaces above the semiconductor mesas 192. According to an embodiment the spacer layer includes a first dielectric layer 231, for example a silicon oxide layer resulting from a process using TEOS as a precursor material, and a second dielectric layer 232, which may be a silicate glass, for example BSG (boron silicate glass), (PSG phosphorus silicate glass), BPSG (boron phosphorus silicate glass) or undoped silicate glass. According to an embodiment, the first dielectric layer 231 may be a TEOS layer with a uniform thickness in a range from 15 nm and 25 nm, for example about 20 nm, and the second dielectric layer 232 may be a BPSG layer with a uniform thickness in a range from 40 nm to 60 nm, for example about 50 nm. An RTP (rapid thermal process) may anneal the implant zones 110a to generate source zones 110 without allowing a reflow of the spacer layer.

A spacer etch is performed to remove horizontal portions of the spacer layer above the alignment plugs 250 and the semiconductor mesas 192 to form contact spacers 305 along sidewalls of the alignment plugs 250, for example along the gate contact spacers 252.

Figure 3F:
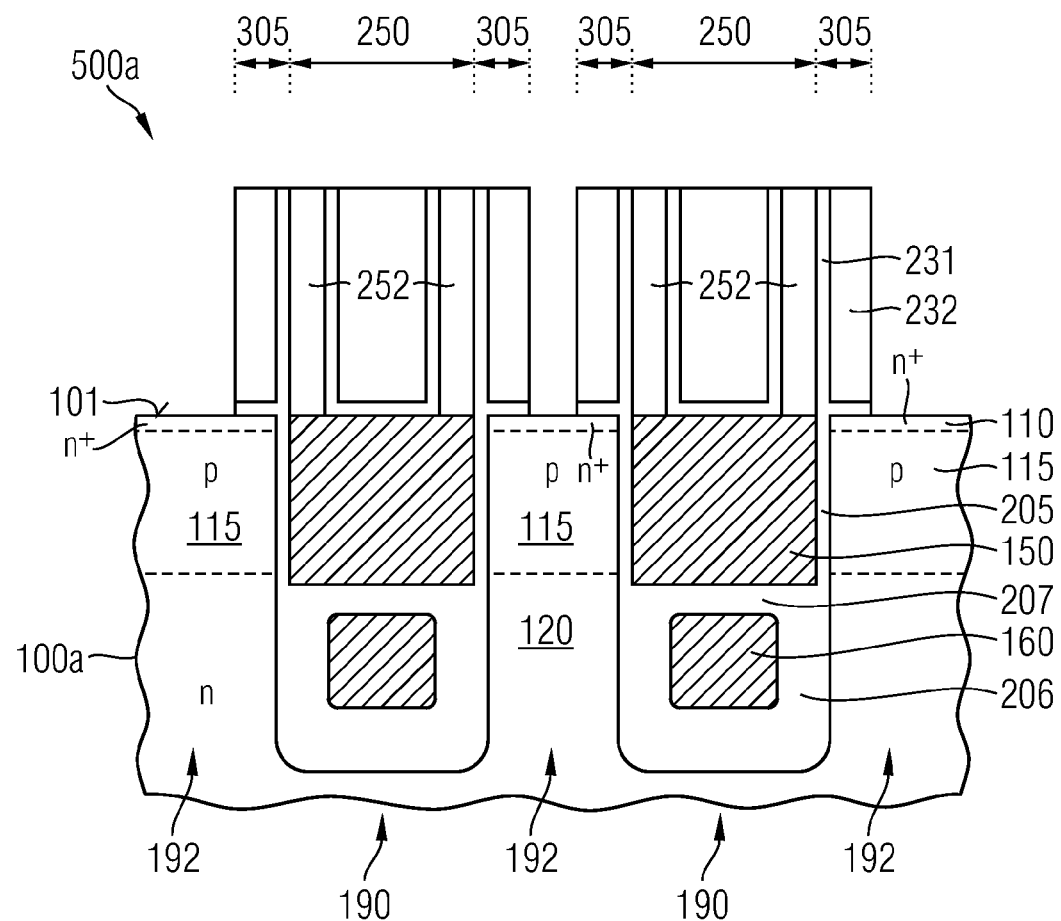
FIG. 3F is a schematic cross-sectional view of the semiconductor substrate portion of FIG. 3E after forming contact spacers.
Figure 3G:
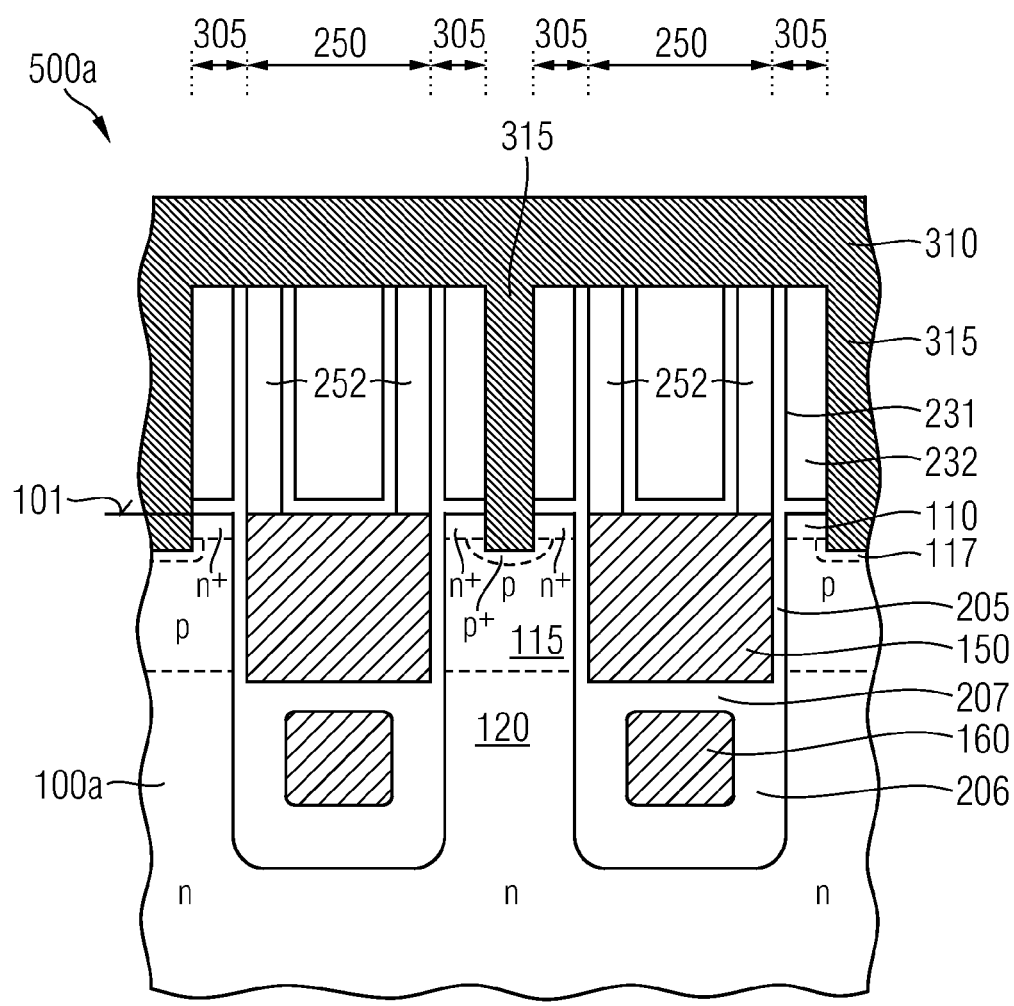
FIG. 3G is a schematic cross-sectional view of the semiconductor substrate portion of FIG. 3F after providing contact plugs.

FIG. 3F shows the contact spacers 305 exposing the main surface 101 in contact areas which are self-aligned to the edges of the subsurface structures 190. The contact spacers 305 may be used as an etch mask to etch contact grooves into the semiconductor mesas 192. Through the bottom of the contact grooves impurities of the second conductivity type may be implanted to form contact zones 117. A further tempering may smooth and round the exposed upper edges of the contact spacers 305. Metal may be deposited to form contact plugs 315 and a first electrode structure 310 electrically connected to the source zones 110 and the body zones 115 through the contact plugs 315 and the contact zones 117 as shown in FIG. 3G.

FIG. 4A shows a semiconductor device 500 with a semiconductor portion 100 having a main surface 101 and a rear surface 102 parallel to the main surface 101. The semiconductor portion 100 is provided from a single-crystal semiconductor material, for example silicon Si, silicon carbide SiC, germanium Ge, a silicon germanium crystal SiGe, gallium nitride GaN or gallium arsenide GaAs. A distance between the first and second surfaces 101, 102 depends typically on the breakdown voltage for which the semiconductor device 500 is specified and is at least 40 µm, for example at least 175 µm. The semiconductor portion 100 may have a rectangular shape with an edge length in the range of several mm or a circular shape with a diameter of several mm. The normal to the main and rear surfaces 101, 102 defines a vertical direction and directions orthogonal to the normal direction are lateral directions.

The semiconductor portion 100 may include an impurity layer 130 of a first conductivity type. The impurity layer 130 may extend along a complete cross-sectional plane of the semiconductor portion 100 parallel to the rear surface 102. In case the semiconductor device 500 is an IGFET (insulated gate field effect transistor), the impurity layer 130 directly adjoins the rear surface 102 and the mean net impurity concentration in the impurity layer 130 is comparatively high, e.g. at least $5\times10^{18}$ cm$^{-3}$. In case the semiconductor device 500 is an IGBT (insulated gate bipolar transistor), a collector layer of the second conductivity type which is the opposite of the first conductivity type is arranged between the impurity layer 130 and the rear surface 102, wherein the mean net impurity concentration in the impurity layer 130 may be between $5\times10^{12}$ and $5\times10^{16}$ cm$^{-3}$, by way of example.

The semiconductor portion 100 further includes a drift layer 120 of the first conductivity type between the main surface 101 and the impurity layer 130, wherein a mean net impurity concentration in the drift layer 120 is at most a tenth of the mean net impurity concentration in the impurity layer 130.

Subsurface structures 190 extend from the main surface 101 into the drift layer 120. The width of the subsurface structures 190 may be between 100 nm and 300 nm, e.g. about 200 nm. The subsurface structures 190 include field electrodes 160 and gate electrodes 150 of a conductive material, respectively, for example polycrystalline silicon. A first field dielectric 206 may dielectrically insulate the field electrodes 160 from the surrounding semiconductor material of the semiconductor portion 100 and a second field dielectric 207 may dielectrically separate the field and gate electrodes 170, 150 from each other. Gate dielectrics 205 dielectrically couple the gate electrodes 150 with body zones 115 of the second conductivity type, which are formed in semiconductor mesas between the subsurface structures 190. The body zones 115 form first pn junctions with source zones 110 directly adjoining the main surface 101 and second pn junctions with the drift layer 120. A width of the semiconductor mesas may be between 150 nm and 250 nm, e.g. about 180 nm. A pitch, i.e. a center-to-center distance, of the semiconductor mesas may be between 350 nm and 450 nm, e.g. 400 nm. Above the subsurface structures 190 dielectric alignment plugs 250 may be formed from one or more dielectric materials. According to the illustrated embodiment, the alignment plugs 250 include gate contact spacers 252, wherein the outer edges of the gate contact spacers 252 are in substance aligned with outer edges of the subsurface structures 190 or the gate electrodes 150. A width of the gate contact spacers 252 may be between 30 nm and 80 nm, e.g. about 50 nm. Along sidewalls of the gate contact spacers 252 oriented to the semiconductor mesas contact spacers 305 are formed above source zones 110 having the same conductivity type as the drift layer 120. The alignment plugs 250 above the gate electrodes 150 may include a dielectric fill 256 having the same construction as the contact spacers 305.

At the side of the main surface 101, a first electrode structure 310, which may be electrically coupled or connected to a source terminal in case the semiconductor device 500 is an IGBT or to an emitter terminal in case the semiconductor device 500 is an IGBT, is provided above a dielectric structure including the alignment plugs 250 and the contact spacers 305. Contact plugs 315 extend between opposing contact spacers 305 from the first electrode structure 310 to the semiconductor portion 100. The contact plugs 315 may have a width of 50 nm to 70 nm, e.g. about 60 nm, may extend into the semiconductor portion 100 and electrically contact the source zones 110 and, through heavily doped contact zones 117, the body zones 115.

A second field electrode structure 320 directly adjoins the rear surface 102 of the semiconductor portion 100. According to embodiments related to super junction IGBTs, the second electrode structure 320 directly adjoins the impurity layer 130. According to embodiments related to IGBTs, a collector layer of the second conductivity type is formed between the impurity layer 130 and the second electrode structure 320.

Each of the first and second electrode structures 310, 320 and the contact plugs 315 may consist of or contain, as main constituent(s) aluminum Al, copper Cu, or alloys of aluminum or copper, for example AlSi, AlCu or AlSiCu. According to other embodiments, one or both of the first and second electrode structures 310, 320 or the contact plugs 315 may contain one or more layers having nickel Ni, titanium Ti, silver Ag, gold Au, platinum Pt, tungsten W and/or palladium Pd as main constituent(s). For example, at least one of the first and second electrode structures 310, 320 includes two or more sub layers, at least one of the sub layers containing one or more of Ni, Ti, Ta, Ag, Au, Pt, W and Pd as main constituent(s), or silicides and/or alloys therefrom.

Figure 4B:
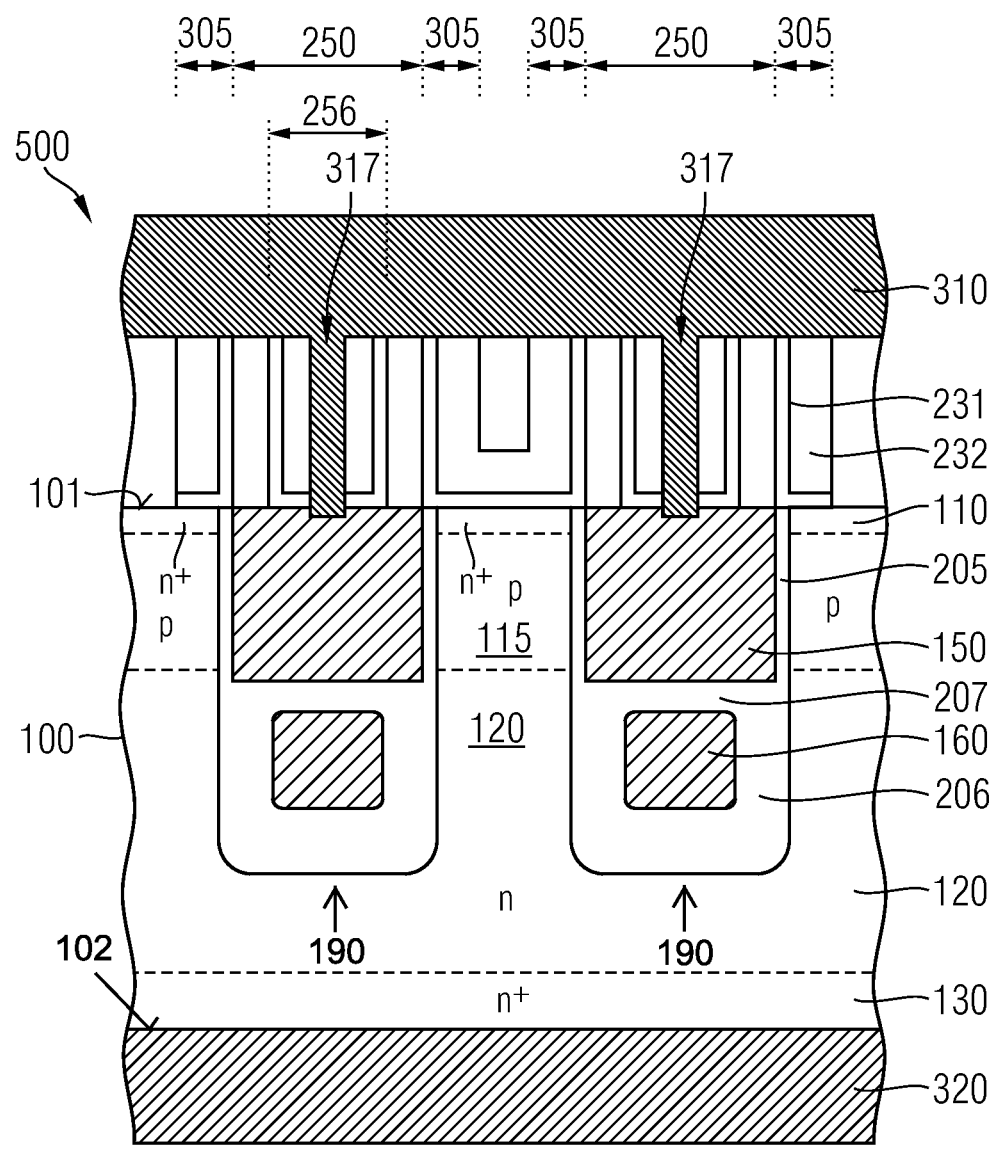
FIG. 4B is a schematic cross-sectional view of a portion of a semiconductor device in accordance with an embodiment providing contact plugs to buried gate electrodes.

FIG. 4B shows gate contacts 317 extending between adjacent ones of the gate contact spacers 252 through the dielectric structure to the gate electrodes 150. The gate contact spacers 252 ensure a minimum distance between the gate contacts 317 on the one hand and gate dielectric 205 and the semiconductor mesas 192 on the other hand, such that the alignment requirements for a lithographic mask providing openings in the alignment plugs 250 for the formation of the gate contacts 317 is relaxed. According to other embodiments, the formation of the gate contacts 317 may follow a removal of the place holder structures 254 (see FIG. 3E).

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of manufacturing a semiconductor device, the method comprising:
    growing selectively semiconductor oxide pillars on semiconductor mesas formed between precursor structures extending from a main surface into a semiconductor substrate;
    filling spaces between the semiconductor oxide pillars with at least one auxiliary material to form alignment plugs in a vertical projection of the precursor structures;
    removing the semiconductor oxide pillars selectively against the alignment plugs;
    providing contact spacers along sidewalls of the alignment plugs; and
    providing contact plugs directly adjoining the semiconductor mesas between opposing ones of the contact spacers.

2. The method according to claim 1, wherein growing selectively the semiconductor pillars comprises:
    exposing sidewalls of the semiconductor mesas in upper sections of the precursor structures adjoining the main surface; and
    treating at least one of the main surface and the exposed sidewalls to obtain, during growth of the semiconductor oxide pillars, different oxide growth rates on the main surface and the exposed sidewalls.

3. The method according to claim 1, wherein growing the semiconductor pillars selectively comprises:
    providing at least upper portions of the precursor structures from a sacrificial material;
    introducing first impurities through the main surface to form implant zones in the semiconductor mesas; and
    removing the sacrificial material.

4. The method according to claim 3, further comprising:
    growing the semiconductor oxide pillars with a higher growth rate on portions of the semiconductor substrate with a first impurity concentration than on portions with a second, lower impurity concentration.

5. The method according to claim 3, further comprising:
    forming a stop layer lining the upper portions before providing the sacrificial material.

6. The method according to claim 3, further comprising:
    planarizing the main surface after providing the sacrificial material and before introducing the impurities to form the implant zones.

7. The method according to claim 3, further comprising:
    introducing second impurities having a second conductivity type opposite to a first conductivity type of the first impurities into the semiconductor mesas before removing the sacrificial material.

8. The method according to claim 3, wherein the semiconductor oxide is grown by a wet oxidation process.

9. The method according to claim 3, wherein forming the alignment plugs comprises:
    forming gate contact spacers of a first auxiliary material along sidewalls of the semiconductor oxide pillars; and
    forming place holder structures of a second, different auxiliary material between the gate contact spacers.

10. The method according to claim 9, further comprising:
    removing the place holder structures to form contact openings; and
    forming gate contacts in the contact openings.

* * * * *